US012360789B2

(12) United States Patent
MacDonald (10) Patent No.: US 12,360,789 B2
(45) Date of Patent: Jul. 15, 2025

(54) MULTI-PROTOCOL FILE TRANSFER MODELING

(71) Applicant: Disney Enterprises, Inc., Burbank, CA (US)

(72) Inventor: John MacDonald, Los Angeles, CA (US)

(73) Assignee: Disney Enterprises, Inc., Burbank, CA (US)

( * ) Notice: Subject to any disclaimer, the term of this patent is extended or adjusted under 35 U.S.C. 154(b) by 961 days.

(21) Appl. No.: 17/468,542

(22) Filed: Sep. 7, 2021

(65) Prior Publication Data

US 2022/0083359 A1   Mar. 17, 2022

Related U.S. Application Data

(60) Provisional application No. 63/077,311, filed on Sep. 11, 2020.

(51) Int. Cl.
*G06F 9/455* (2018.01)
*G06F 30/20* (2020.01)

(52) U.S. Cl.
CPC .............. *G06F 9/455* (2013.01); *G06F 30/20* (2020.01)

(58) Field of Classification Search
CPC .......... G06F 9/455; G06F 30/20; G06F 30/25; G06F 30/27; G06F 30/28; G06F 2111/00; G06F 2119/22
See application file for complete search history.

(56) References Cited

U.S. PATENT DOCUMENTS

| 9,395,920 | B2* | 7/2016 | Deng ................... G06F 3/0676 |
| 11,061,605 | B1* | 7/2021 | Biondo, Jr. ........... G06F 3/0604 |
| 11,170,104 | B1* | 11/2021 | Stickle .................. G06N 20/00 |
| 11,797,856 | B1* | 10/2023 | Oezer .................... G06N 3/092 |
| 2006/0161635 | A1* | 7/2006 | Lamkin .................. G06F 16/16 |
| | | | 709/217 |

OTHER PUBLICATIONS

Sudharshan Vazhkudai and Jennifer M. Schopf. Using Regression Techniques to Predict Large Data Transfers. The International Journal of High Performance Computing Applications. Aug. 1, 2003. pp. 1-6.

* cited by examiner

*Primary Examiner* — Kibrom K Gebresilassie
(74) *Attorney, Agent, or Firm* — Farjami & Farjami LLP (57) ABSTRACT

A system includes a computing platform having processing hardware, and a system memory storing a software code. The processing hardware is configured to execute the software code to identify a file transfer protocol among multiple file transfer protocols for transferring one or more file(s), to determine, using a test data sample and the file transfer protocol, one or more parameter(s) correlated with a time required for transferring the file(s) using the file transfer protocol, and to provide, based on the parameter(s), an algorithm for transferring the file(s) using the file transfer protocol. The processing hardware is further configured to perform, using the algorithm, a file transfer simulation of the file(s) using the file transfer protocol, to provide, using the file transfer simulation, data pooling parameters for transferring the file(s), and to estimate, based on the file transfer simulation and the data pooling parameters, an elapsed time for transferring the file(s).

18 Claims, 12 Drawing Sheets

Fig. 1

File Transfer Protocol "A" — 330

| Workspace | Space Used | Disk Space | Files | Elapsed | Threads |
|---|---|---|---|---|---|
| SET_ONE_SMALL | 208.35GB | 216.12GB | 20518 | 13:53:41 | 20 |
| SET_ONE_LARGE03 | 2070.23GB | 2072.62GB | 7791 | 7:34:24 | 20 |
| SET_TWO_LARGE01 | 1453.88GB | 1456.66GB | 8975 | 5:43:21 | 40 |
| SET_TWO_LARGE02 | 2534.06GB | 2540.11GB | 10719 | 15:19:08 | 40 |
| SET_TWO_LARGE03 | 1708.73GB | 1711.27GB | 8081 | 2:41:00 | 100 |
| SET_TWO_LARGE01 | 1453.88GB | 1456.66GB | 8975 | 10:32:00 | 20 |
| SET_TWO_LARGE04 | 2053.11GB | 2056.35GB | 10769 | 11:19:15 | 20 |
| SET_TWO_LARGE03 | 1708.73GB | 1711.27GB | 8081 | 8:41:34 | 20 |

```
elapsed_correlation_fig = draw_correlation_figure(pd.DataFrame(df.corr()['elapsed'].drop('elapsed').sort_values()))
def draw_correlation_figure(correlation):
    plt.clf()
    plt.figure(figsize=[5,5])
    ax = sns.heatmap(correlation, fmt="g", cmap="PiYG", annot=True, center=0)
    ax.figure.tight_layout()
    figfile = BytesIO()
    plt.savefig(figfile, format='png')
    figfile.seek(0)
    return base64.b64encode(figfile.getvalue()).decode('utf-8')
```

| Workspace | Space Used | Files | Elapsed | Threads | Mean File Size | Space Delta | Sd Per Gb |
|---|---|---|---|---|---|---|---|
| SET_ONE_SMALL | 208.35GB | 20518 | 13:53:41 | 20 | 10.53MB | 7.77GB | 0.0372930165586753306 |
| SET_ONE_LARGE03 | 2070.23GB | 7791 | 7:34:24 | 20 | 266.03MB | 2.39GB | 0.00115446109852852846 |
| SET_TWO_LARGE01 | 1453.88GB | 8975 | 5:43:21 | 40 | 162.3MB | 2.78GB | 0.00191212479709446707 |
| SET_TWO_LARGE02 | 2534.06GB | 19719 | 16:19:08 | 40 | 128.82MB | 6.05GB | 0.00238747306693560632 |
| SET_TWO_LARGE03 | 1708.73GB | 8081 | 2:41:00 | 100 | 211.76MB | 2.54GB | 0.00148648411393326697 |
| SET_TWO_LARGE01 | 1453.88GB | 8975 | 10:32:00 | 20 | 162.3MB | 2.78GB | 0.00191212479709446707 |
| SET_TWO_LARGE04 | 2053.11GB | 10769 | 11:19:15 | 20 | 190.95MB | 3.24GB | 0.00157809937232328665 |
| SET_TWO_LARGE03 | 1708.73GB | 8081 | 8:41:34 | 20 | 211.76MB | 2.54GB | 0.00148648411393326697 |

Select Multiple Variables
Files
Elapsed
Threads
Add Revision
Mean File Size

OLS Regression Results
⟵ 660

| | | | | |
|---|---|---|---|---|
| Dep. Variable: | elapsed | R-squared (uncentered): | | 0.954 |
| Model: | OLS | Adj. R-squared (uncentered): | | 0.939 |
| Method: | Least Squares | F-statistic: | | 62.34 |
| Date: | Fri, 04 Sep 2020 | Prob (F-statistic): | | 9.68e-05 |
| Time: | 12:15:30 | Log-Likelihood: | | -83.152 |
| No. Observations: | 8 | AIC: | | 170.3 |
| Df Residuals: | 6 | BIC: | | 170.5 |
| Df Model: | 2 | | | |
| Covariance Type: | nonrobust | | | |

| | coef | std err | t | P>|t| | [0.025 | 0.975] |
|---|---|---|---|---|---|---|
| files — 661 | 3.1365 | 0.357 | 8.794 | 0.000 | 2.264 | 4.009 |
| threads | -125.9738 | 103.428 | -1.218 | 0.269 | -379.053 | 127.105 |

663

| | | | | |
|---|---|---|---|---|
| Omnibus: | 0.448 | Durbin-Watson: | | 1.209 |
| Prob(Omnibus): | 0.800 | Jarque-Bera (JB): | | 0.480 |
| Skew: | -0.333 | Prob(JB): | | 0.787 |
| Kurtosis: | 2.001 | Cond. No. | | 405. |

```
#the following is example code, not the actual code (as we saw that I'd gone in and hard coded it at some point =/ )
# multiple linear regression (simple a*b + c*d) trivial to extend to bringing in exponential or such
def make_predictions(coefficients, workspaces):
    prediction = 0
    for key in coefficients.keys():
        prediction += coefficients[key] * workspaces[key] # Multiple the coefficient value by the value held in the workspaces dict
    return prediction
```

```
def split_into_pools(predictions, pools):
    """split predictions into x pools,"""
    sorted_predictions = sorted(predictions, key = lambda i: i['prediction'], reverse=True )
    prediction_pools = [[] for i in range(pools)]
    total_predictions = [0 for i in range(pools)]
    for prediction in sorted_predictions:
        next_pool = [ j for i, j in enumerate(total_predictions) if j == min(total_predictions)][0]
        value = prediction['prediction']
        del prediction['prediction'] # Remove non-human readable
        prediction_pools[next_pool].append(prediction)
        total_predictions[next_pool] += value
    return prediction_pools, total_predictions
```

```
{% for i in range(predictions|length) %}
    {% set pool = predictions[i] %}
    <div class="col">
        <h3>Pool {{ i }}</h3>
        <table class="table table-hover">
            <thead class="thead-dark">
                <tr>{% for column in columns %}
                    <th>{{ column }}</th>
                {% endfor %}</tr>
            </thead>
            <tbody>
            {% for prediction in pool %}
                <tr>
                    {% for column in prediction.keys() %}
                    <td>{{ prediction[column] }}</td>
                    {% endfor %}
                </tr>
            {% endfor %}
            {% if sync_offset != 0 %}
            <tr><td>Sync Offset</td><td>{{sync_offset}}:00:00</td></tr>
            {% endif %}
            {% if failure %}
            <tr><td>Failure +1 Sync Offset</td><td>{{sync_offset}}:00:00</td></tr>
            {% endif %}
            <tr><td><strong>Total Estimate</td><td>{{ total_predictions[i] }}</td></tr>
        </table>
    </div>
{% endfor %}
```

MULTI-PROTOCOL FILE TRANSFER MODELING

RELATED APPLICATION(S)

The present application claims the benefit of and priority to a Provisional Patent Application Ser. No. 63/077,311, filed Sep. 11, 2020, and titled "Multi-Protocol File Transfer Modeling," which is hereby incorporated fully by reference into the present application.

BACKGROUND

With the advent of big data and the ever growing use of cloud-based computing resources for performing data processing, the transfer of enormously large numbers of data files, such as millions of data files, for example, has become relatively commonplace. Accurately estimating the amount of time required to complete a large file transfer is important for efficient utilization of computing resources and network bandwidth. However, obtaining an accurate estimate for the time required to complete large file transfers between computing environments has proven to be challenging, due in part to the use of different file transfer protocols by different vendors. For example, although a naïve approach may assume that simply knowing the amount of data to be transferred and the capacity of bandwidth of the data transfer pipeline provided by a vendor enable a reasonable file transfer time estimate, in practice that naïve calculation may be inaccurate by as much as seventy-five percent. Consequently, there is a need in the art for a more accurate solution for estimating the time required to transfer large files or large numbers of files between computing environments.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present application discloses a multi-protocol file transfer modeling solution that overcomes the drawbacks and deficiencies in the conventional art. In one exemplary implementation, a sample of test data is used to probe the performance characteristics of a file transfer protocol in order to identify which data parameters correlate most strongly with the time required to transfer data (hereinafter "elapsed time" using that protocol. Based on those correlations, as well as, in some implementations, covariances amongst the parameters, an algorithm for governing file transfer can be generated that is substantially optimized for the file transfer protocol to be used, as well as for the one or more files to be transferred. That algorithm can then be used to simulate file transfer so as to provide data pooling parameters for performing file transfer in parallel, as well as an estimate of total elapsed time for file transfer that is substantially more accurate than those presently obtainable from the conventional art. Moreover, in some implementations, the present novel and inventive concepts further advantageously enable performance of the disclosed multi-protocol file transfer modeling solution as an automated process.

It is noted that, as defined in the present application, the terms "automation," "automated," and "automating" refer to systems and processes that do not require the participation of a but an user, such as a human editor or supervisor. Although, in some implementations, a human system administrator may review the performance of the automated systems operating according to the automated methods described herein, that human involvement is optional. Thus, the methods described in the present application may be performed under the control of hardware processing components of the disclosed systems.

It is further noted that, as defined in the present application, the expression "file transfer protocol" refers to any one of multiple communication standards or proposed standards for governing the exchange of data files between computers over a communication network. Examples of file transfer protocols include File Transfer Protocol (FTP), Trivial FTP (TFTP), Simple FTP (SFTP), FTP Secure (FTPS), Hypertext Transfer Protocol (HTTP), HTTP Secure (HTTPS), Secure Hypertext Transfer Protocol (S-HTTP), and SSH file transfer protocol, to name a few.

Figure 1:
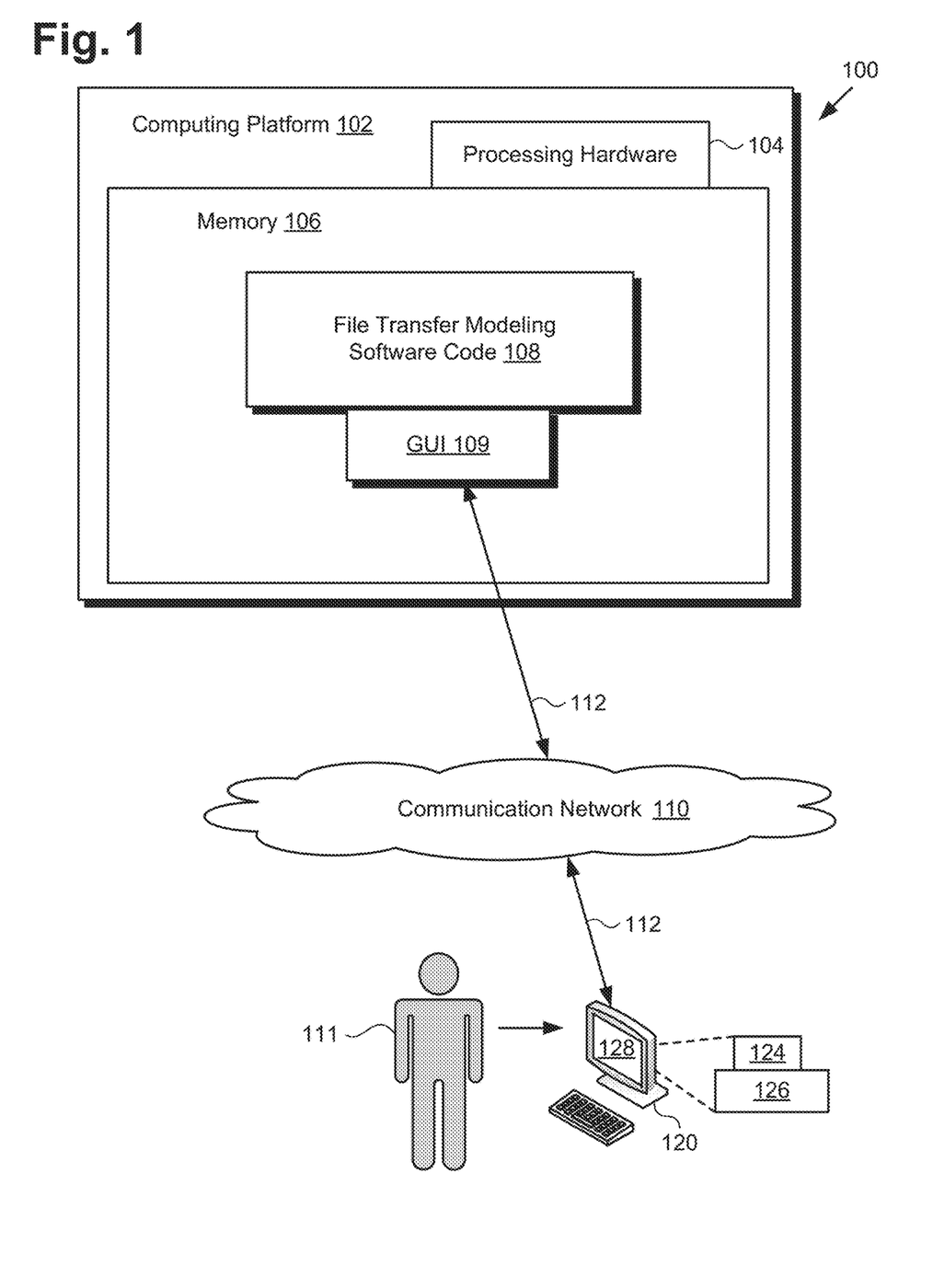
FIG. 1 shows a diagram of an exemplary system for performing multi-protocol the transfer modeling, according to one implementation.

FIG. 1 shows exemplary system 100 for performing multi-protocol file transfer modeling, according to one implementation. As shown in FIG. 1, system 100 includes computing platform 102 having processing hardware 104 and system memory 106 implemented as a computer-readable non-transitory storage medium. According to the present exemplary implementation, system memory 106 stores file transfer modeling software code 108 providing graphical user interface (GUI) 109.

As further shown in FIG. 1, system 100 is implemented within a use environment including communication network 110, user system 120 including display 128, and in some implementations, optional user system processing hardware 124 and user system memory 126. In addition, FIG. 1 shows system user 111 utilizing user system 120 to communicate with system 100. Also shown in FIG. 1 are network communication links 112 interactively connecting user system 120 with system 100 via communication network 110.

Although the present application refers to file transfer modeling software code 108 as being stored in one or both of system memory 106 and user system memory 126 for conceptual clarity, more generally, system memory 106 and user system memory 126 may take the form of any computer-readable non-transitory storage medium. The expression "computer-readable non-transitory storage medium," as used in the present application, refers to any medium, excluding a carrier wave or other transitory signal that provides instructions to processing hardware 104 of computing platform 102, or to user system processing hardware 124 of user system 120. Thus, a computer-readable non-transitory medium may correspond to various types of media, such as volatile media and non-volatile media, for example. Volatile media may include dynamic memory, such as dynamic random access memory (dynamic RAM), while non-volatile memory may include optical, magnetic, or electrostatic storage devices. Common forms of computer-readable non-transitory media include, for example, optical discs, RAM, programmable read-only memory (PROM), erasable PROM (EPROM), and FLASH memory.

Moreover, although FIG. 1 depicts file transfer modeling software code 108 as being stored in its entirety in system memory 106 that representation is also provided merely as an aid to conceptual clarity. More generally, system 100 may include one or more computing platforms 102, such as computer servers for example, which may be co-located, or may form an interactively linked but distributed system, such as a cloud based system, for instance. As a result, processing hardware 104 and system memory 106 may correspond to distributed processor and memory resources within system 100.

Each of processing hardware 104 of computing platform 102 and user system processing hardware 124 may include multiple hardware processing units, such as one or more central processing units, one or more graphics processing units, one or more tensor processing units, one or more field-programmable gate arrays (FPGAs), and an application programming interface (API) server, for example. By way of definition, as used in the present application, the terms "central processing unit" (CPU), "graphics processing unit" (GPU), and "tensor processing unit" (TPU) have their customary meaning in the art. That is to say, a CPU includes an Arithmetic Logic Unit (ALU) for carrying out the arithmetic and logical operations of computing platform 102 or user system 120, as well as a Control Unit (CU) for retrieving programs, such as file transfer modeling software code 108, from system memory 106 or user system memory 126, while a GPU may be implemented to reduce the processing overhead of the CPU by performing computationally intensive graphics or other processing tasks. A TPU is an application-specific integrated circuit (ASIC) configured specifically for artificial intelligence (AI) applications such as machine learning modeling.

In some implementations, computing platform 102 may correspond to one or more web servers, accessible over a packet-switched network such as the Internet, for example. Alternatively, computing platform 102 may correspond to one or more computer servers supporting a private wide area network (WAN), local area network (LAN), or included in another type of limited distribution or private network. As yet another alternative, in some implementations, system 100 may be implemented virtually, such as in a data center. For example, in some implementations, system 100 may be implemented in software, or as virtual machines.

User system 120 and communication network 110 enables system user 111 to interact with system 100 and to use file transfer modeling software code 108, executed by processing hardware 104, to generate an elapsed time estimate for the transfer of files. In some implementations, file transfer modeling software code 108 may be utilized directly by user system 120. For example, file transfer modeling software code 108 may be transferred to user system memory 126, via download over communication network 110, for example, or via transfer using a computer-readable non-transitory medium, such as an optical disc or FLASH drive. In those implementations, file transfer modeling software code 108 may be persistently stored on user system memory 126, and may be executed locally on user system 120 by user system processing hardware 124.

Although user system 120 is shown as a desktop computer in FIG. 1, that representation is provided merely as an example. More generally, user system 120 may be any suitable mobile or stationary computing device or system that implements data processing capabilities sufficient to provide a user interface, support connections to communication network 110, and implement the functionality ascribed to user system 120 herein. For example, in some implementations, user system 120 may take the form of a laptop computer, tablet computer, or smartphone, for example. However, in other implementations user system 120 may be a "dumb terminal" peripheral component of system 100 that enables system user 111 to provide inputs via a keyboard or other input device, as well as to view GUI 109 on display 128. In those implementations, user system 120 and display 128 may be controlled by processing hardware 104 of system 100. Alternatively, system user 111 may utilize processing hardware 124 of user system 120 to execute file transfer modeling software code 108 stored in user system memory 126, thereby generating an elapsed time estimate for file transfer locally.

With respect to display 128 of user system 120, display 128 may be physically integrated with user system 120 or may be communicatively coupled to but physically separate from user system 120. For example, where user system 120 is implemented as a smartphone, laptop computer, or tablet computer, display 128 will typically be integrated with user system 120. By contrast, where user system 120 is implemented as a desktop computer, display 128 may take the form of a monitor separate from user system 120 in the form of a computer tower. Moreover, display 128 may be implemented as a liquid crystal display (LCD), a light-emitting diode (LED) display, an organic light-emitting diode (OLED) display, a quantum dot (QD) display, or a display using any other suitable display technology that performs a physical transformation of signals to light.

Figure 2:
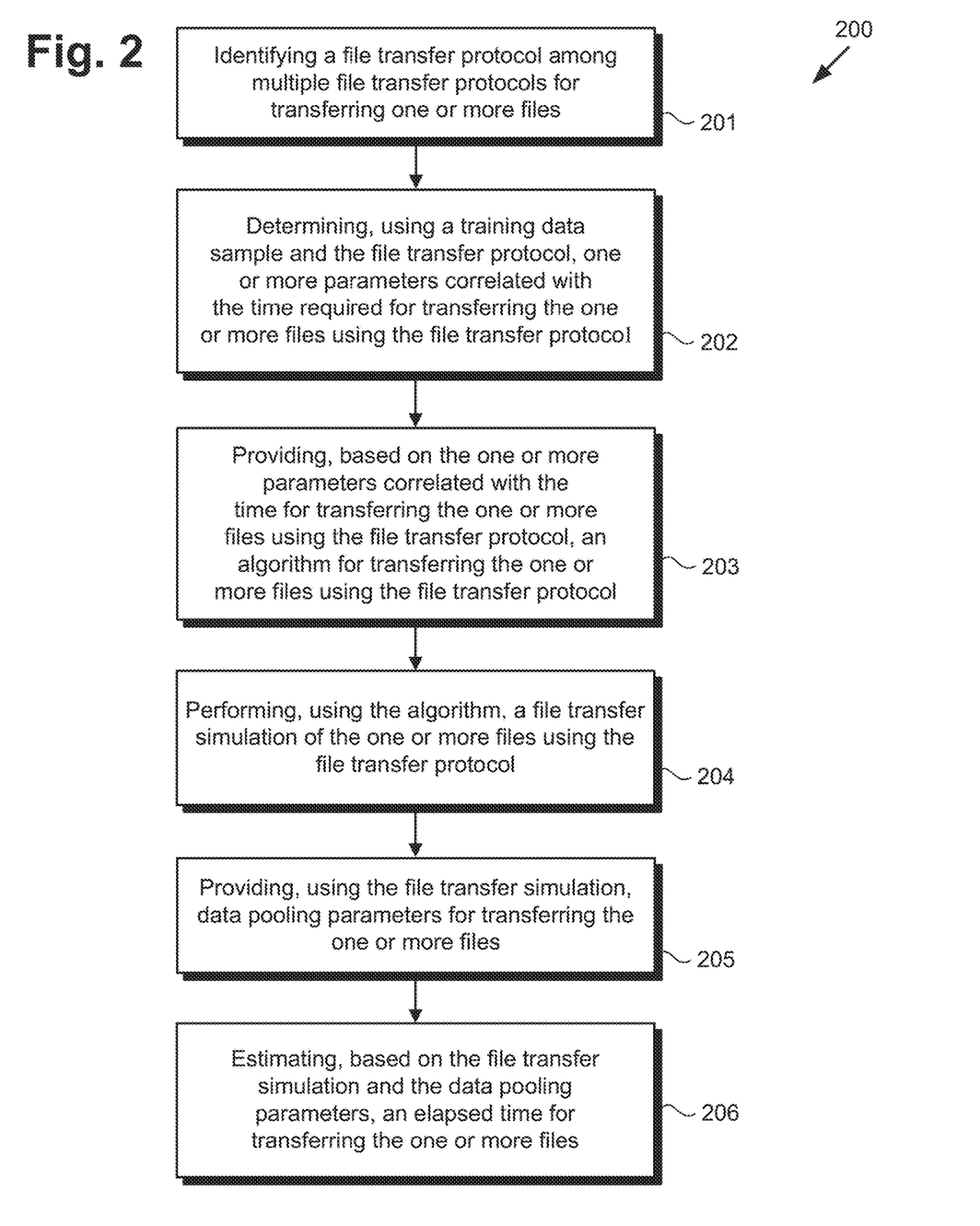
FIG. 2 shows a flowchart outlining an exemplary method for performing multi-protocol file transfer modeling, according to one implementation.

The functionality of file transfer modeling software code 108 is further described below by reference to FIG. 2 in conjunction with FIGS. 3, 4A, 4B, 5, 6A, 6B, 7, 8A, 8B, 8C, and 8D. FIG. 2 shows flowchart 200 presenting an exemplary method for use by system 100, or user system 120, to perform multi-protocol file transfer modeling, according to one implementation. With respect to the method outlined in FIG. 2, it is noted that certain details and features have been left out of flowchart 200 in order not to obscure the discussion of the inventive features in the present application.

Referring to FIGS. 1 and 2 in combination, flowchart 200 includes identifying a file transfer protocol among multiple file transfer protocols for transferring one or more files (action 201). As noted above, many file transfer protocols for governing the exchange of data files between computers over a communication network exist. As further noted above, examples of such file transfer protocols include File Transfer Protocol (FTP), Trivial FTP (TFTP), Simple FTP (SFTP), FTP Secure (FTPS), Hypertext Transfer Protocol (HTTP), HTTP Secure (HTTPS), Secure Hypertext Transfer Protocol (S-HTTP), and SSH file transfer protocol, to name a few.

Action 201 may be the first step in the identification of an optimal file transfer protocol for a particular data file or group of data files, through modeling of file transfer using one or more available file transfer protocols, based on various characteristics of the data file or files, such as the number of files, the size of the file, or the mean size of the files when more than one data file is being transferred, for example. In the exemplary modeling process outlined by flowchart 200 and described below, exemplary "file transfer protocol 'A'" is identified in action 201. In some implementations, identification of file transfer protocol "A" in action 201 may be performed by file transfer modeling software code 108, executed by processing hardware 104 of computing platform 102. However, in other implementations, action 201 may be performed by file transfer modeling software code 108, executed by user system processing hardware 124 of user system 120.

Figure 3:
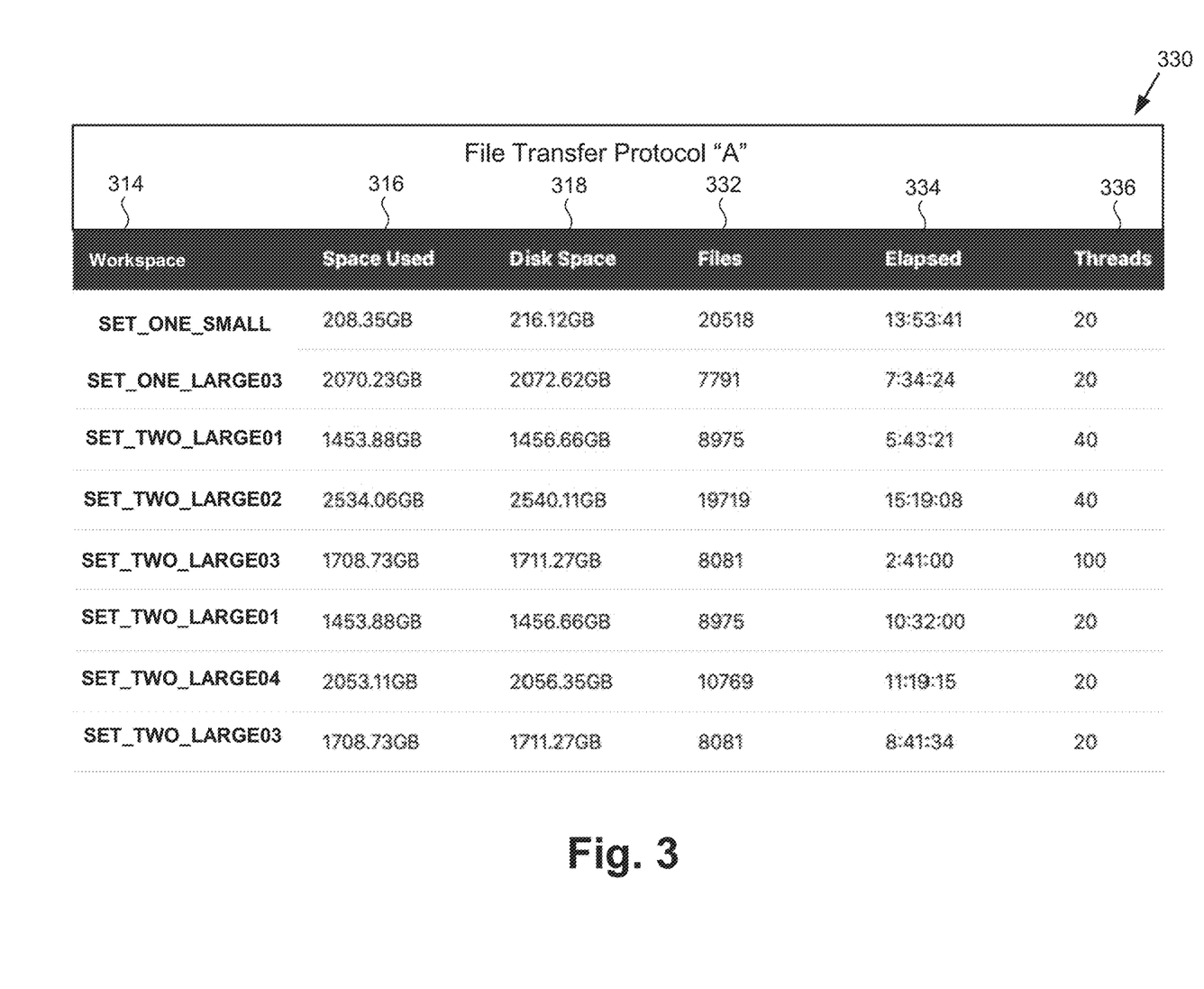
FIG. 3 shows a table describing the performance of a particular file transfer protocol in response to test data, according to one implementation.

Flowchart 200 further includes determining, using a test data sample and the file transfer protocol identified in action 201, one or more parameters correlated with the time required for transferring the one or more files using the identified file transfer protocol (action 202). Referring to FIG. 3, FIG. 3 shows table 330 describing the performance of file transfer protocol "A" in response to a test data sample including test data from file workspaces or directories 314 (hereinafter "workspaces 314"). In addition to identifying workspaces 314 by name, table 330 describes the space used 316 by the files included in each of workspaces 314, the disc space 318 occupied by each of workspaces 314, the number of files 332 (hereinafter "files 332") contained in each of workspaces 314, the number of computing threads of execution 336 (hereinafter "threads 336") dedicated to transfer of each of workspaces 314, and the elapsed time 334 for transfer of each of workspaces 314 using threads 336 and file transfer protocol "A."

Figure 4A:
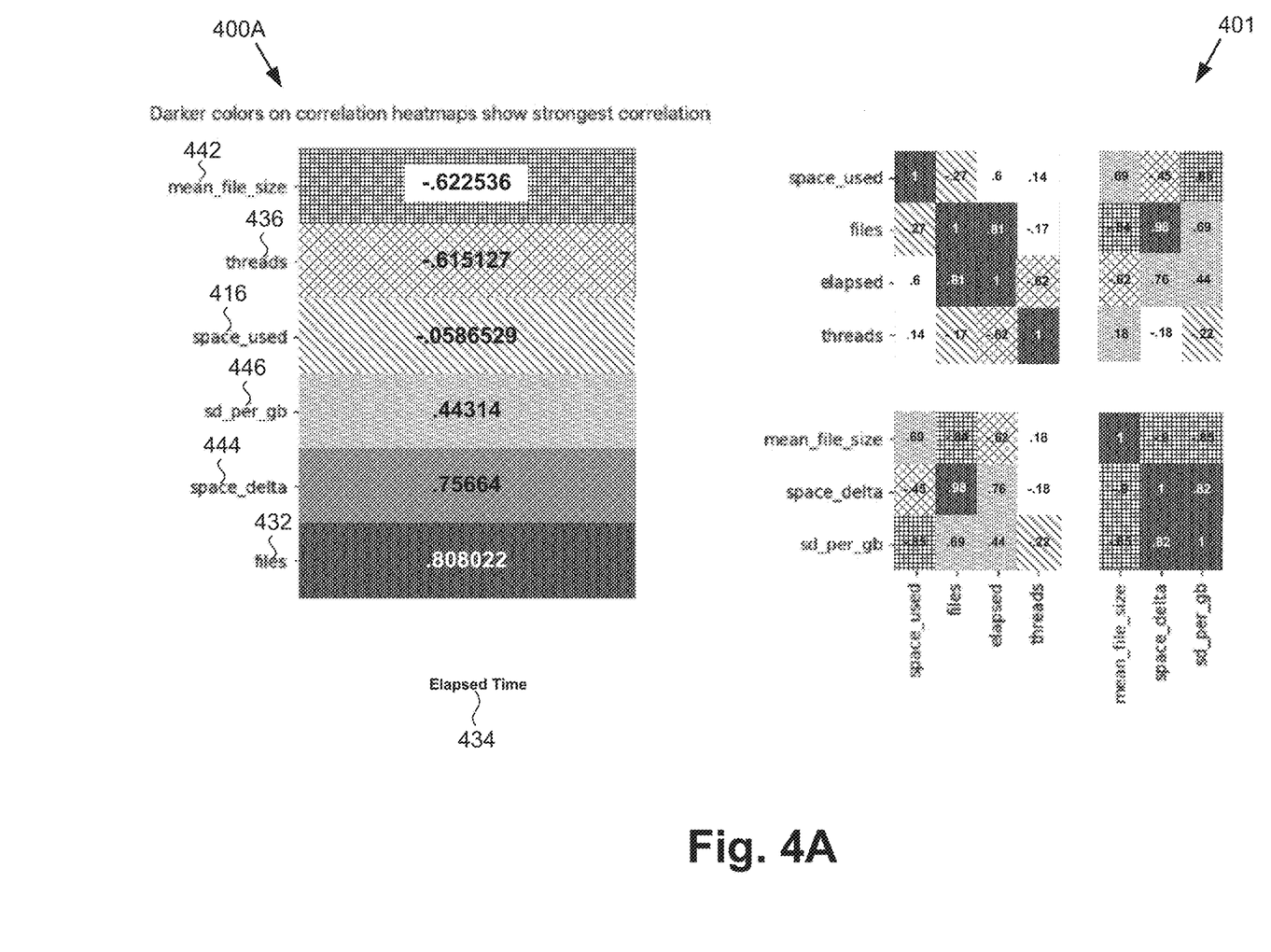
FIG. 4A shows an exemplary correlation heatmap and an exemplary covariance heat chart for multiple data transfer parameters, according to one implementation.

Based on the testing of file transfer protocol "A" outlined by table 330, the correlation of one or more parameters of workspaces 314 with elapsed time 334 may be determined in action 202 using file transfer software code 108, executed either by processing hardware 104 of computing platform 102, or by user system processing hardware 124 of user system 120. FIG. 4A shows correlation heatmap 400A and covariance heat chart 401. As to noted in FIG. 4A, darker or bolder fill patterns correspond to stronger correlations between the parameters listed in FIG. 4A and elapsed time 434. Darker or bolder fill patterns on covariance heat chart 401 also correspond to greater covariance among those parameters. As shown in FIG. 4A, the parameters being correlated with elapsed time 434 include mean file size 442, threads 436, space used 416, space delta 444, space delta per gigabyte 446, and files 432.

It is noted that the parameters, space used 416, files 432, elapsed time 434, and threads 436, correspond respectively in general to space used 316, files 332, elapsed time 334, and threads 336, in FIG. 3. Thus, the parameters, space used 416, files 432, elapsed time 434, and threads 436, may share any of the characteristics attributed to respective space used 316, files 332, elapsed time 334, and threads 336 by the present disclosure, and vice versa. It is further noted, that as defined in the present application, the parameter "space delta" 444 refers to the difference between disc space 318 and space used 316/416 while the parameter space delta per gigabyte 446 refers to space delta per gigabyte of data in each of workspaces 314.

Correlation heatmap 400A and covariance heat chart 401 shown in FIG. 4A depict one exemplary process for identifying one or more parameters among mean file size 442, threads 336/436, space used 316/416, space delta 444, space delta per gigabyte 446, and files 332/432 for predicting elapsed time 334/434 for file transfer using file transfer protocol "A." In some implementations, the objective may be to identify one or more parameters that are strongly correlated with elapsed time 334/434, but not highly covariant with one another. It is noted that, as used in the present application, highly covariant parameters refer to parameters having a covariance equal to or greater than a predetermined threshold, such as 0.9 or greater for example.

For instance, referring to correlation heatmap 400A, the parameters, mean file size 442, threads 336/436, files 332/432, and space delta 444, show the strongest correlation with elapsed time 334/434. However, covariance heat chart 401 reveals that the parameters, files 332/432 and space delta 444, are highly covariant and consequently should not be used together. Selecting files 332/432 having the stronger correlation to elapsed time 334/434 than space delta 444, covariance heat chart 401 further reveals that the parameter, files 332/432, is also highly covariant with mean file size 442, but has a low covariance with threads 336/436. Based on the information surfaced by correlation heatmap 400A and covariance heat chart 401 the parameters files 332/432 and threads 336/436 appear to be the best parameters for use in modeling elapsed time 334/434 for file transfer using file transfer protocol "A."

However, it is emphasized that, for another file transfer protocol, one or more parameters identified in FIG. 3 or 4A other than files 332/432 and threads 336/436 may be the best parameters for use in modeling elapsed time 334/434 for file transfer using that other file transfer protocol. For example, for some file transfer protocols, the parameters files 332/432 (i.e., number of files) may show less covariance with mean file size 442 and in those use cases the one or more parameter determined in action 202 as being suitable for use in modeling file transfer protocol performance may include one or both of files 332/432 and mean file size 442. Moreover, in other use cases, one or more parameters other than those identified in FIGS. 3A and 4, such as available bandwidth or latency for example, may be determined to be correlated with the time required for transferring the one or more files using that other file transfer protocol. Action 202 advantageously enables use of system 100 or user system 120 to identify potential bottlenecks during data transfer using a particular data transfer protocol.

As described above, in some implementations, when action 202 determines multiple parameters correlated with the time required for transferring the one or more files using the file transfer protocol identified in action 201, action 202 may further include identifying at least one covariance among those multiple parameters, i.e., identifying at least two of the multiple parameters with elapsed time 334/434 as covariant parameters. Action 202 may be performed by file transfer modeling software code 108, executed by processing hardware 104 of computing platform 102, or executed by user system processing hardware 124 of user system 120.

For example, in some implementations, file transfer modeling software code 108 may include a machine learning model, such as a neural network (NN), trained to determine, using the test data sample described above and the file transfer protocol identified in action. 201, the one or more parameters correlated with the time required for transferring the one or more files using the identified file transfer protocol. Moreover, in anticipation of use cases in which multiple parameters are determined to be correlated with the file transfer time using the identified file transfer protocol, such a machine learning model may also be trained to identify one or more covariances among those correlated parameters.

It is noted that, as defined in the present application, the expression "machine learning model" refers to a mathematical model for making future predictions based on patterns learned from samples of data or "training data." Various learning algorithms can be used to map correlations between input data and output data. These correlations form the mathematical model that can be used to make future predictions on new input data. Such a predictive model may include one or more logistic regression models, Bayesian models, or NNs. A "deep neural network," in the context of deep learning, may refer to an NN that utilizes multiple hidden layers between input and output layers, which may allow for learning based on features not explicitly defined in raw data. As used in the present application, any reference to an NN refers to a deep neural network.

Figure 4B:
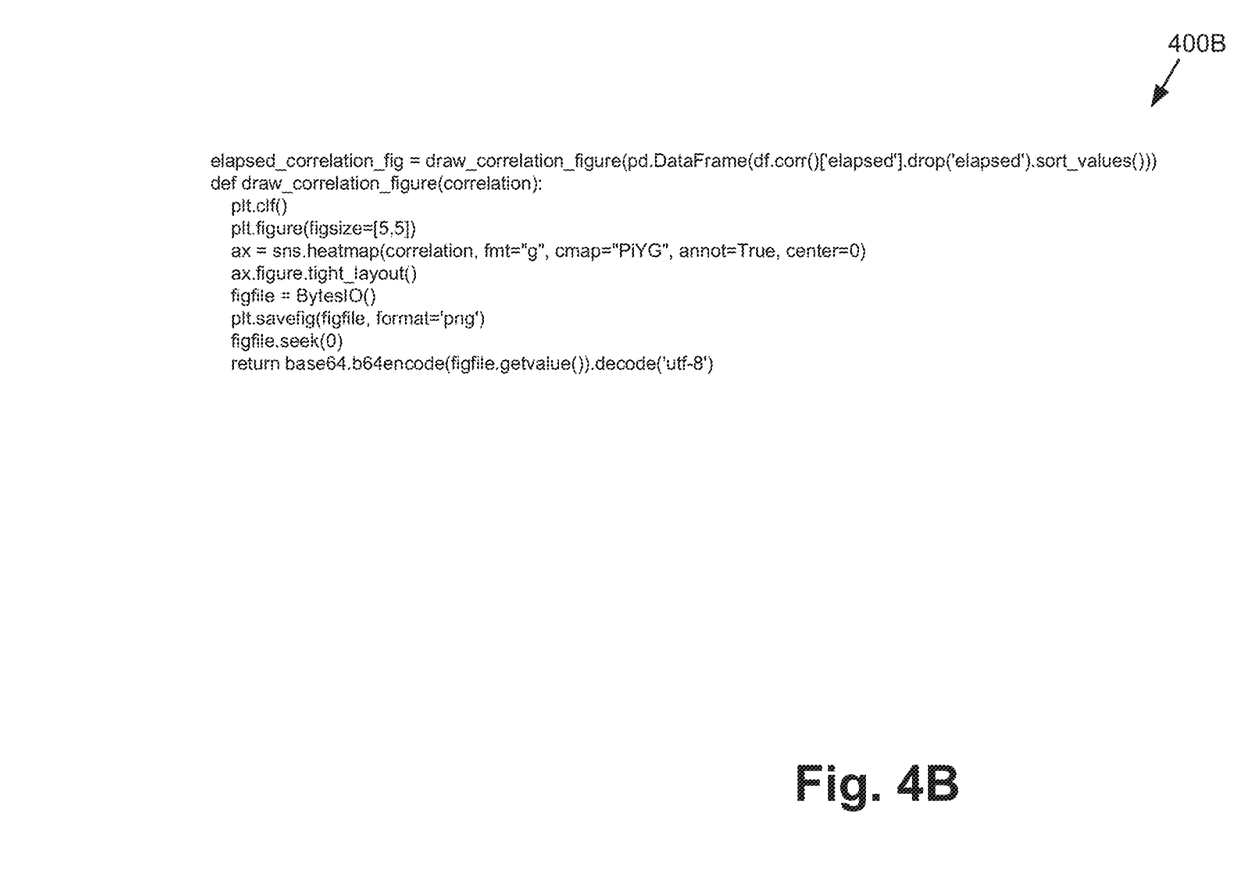
FIG. 4B shows exemplary pseudocode corresponding to generation of the correlation heatmap shown in FIG. 4A, according to one implementation.

Referring to FIG. 4B, FIG. 4B shows exemplary pseudo-code 400B corresponding to generation of correlation heatmap 400A, in FIG. 4A. It is noted that, in some implementations, determination of optimized parameters for modeling elapsed time 334/434 in action 202 may be performed by system user 111, through the visualizations provided by correlation heatmap 400A and covariance heat chart 401 via GUI 109. That is to say, in some implementations processing hardware 104 or user system processing hardware 124 may execute file transfer modeling software code 108 to provide GUI 109 enabling system user 111 to review the parameters shown in FIG. 4A. Moreover, in some implementations, covariant parameters may be identified based on inputs to GUI 109 by system user 110. However, in other implementations, FIG. 4A may be merely representative of an automated calculation performed by file transfer modeling software code 108 without human input from system user 111.

Figure 5:
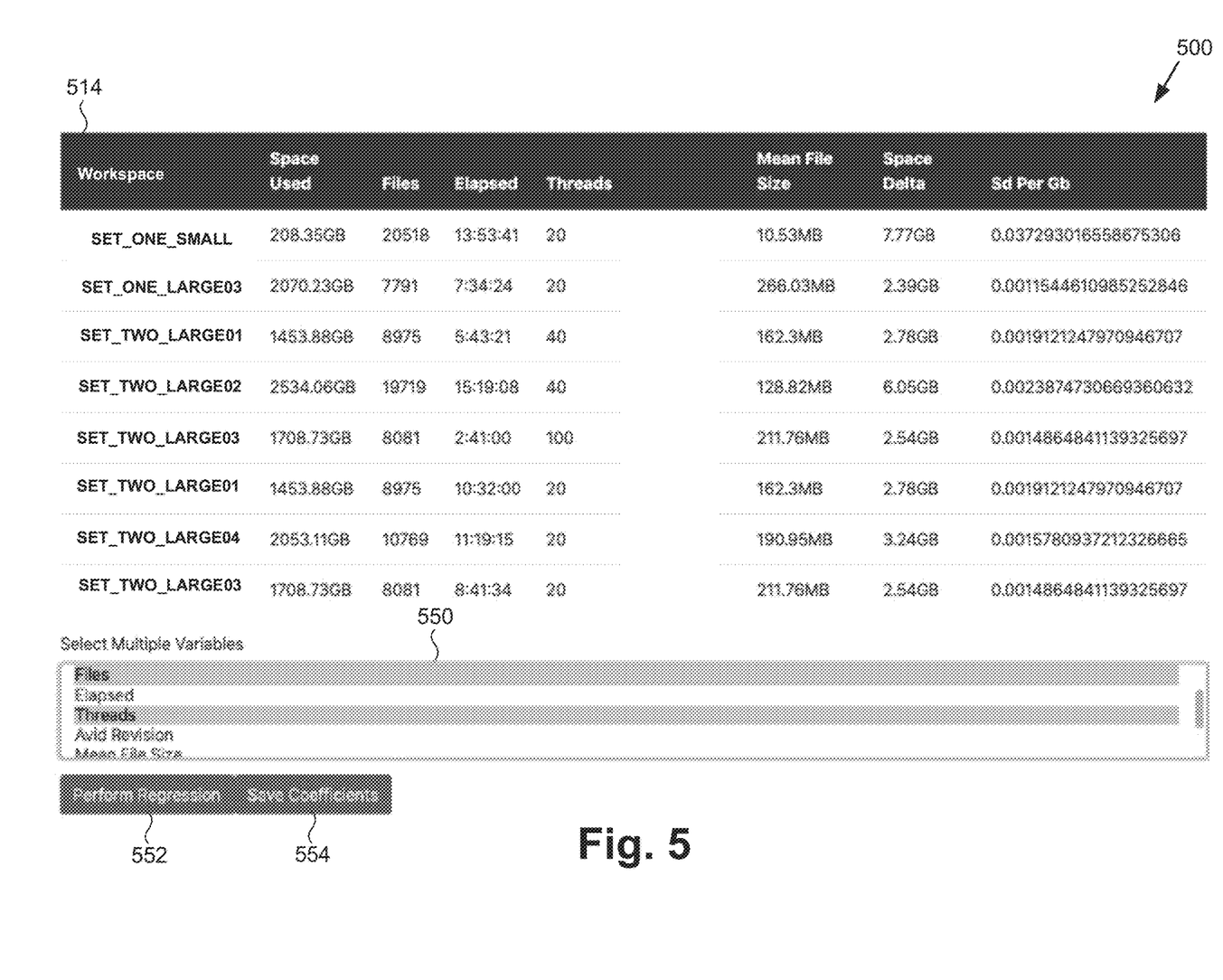
FIG. 5 shows an analysis pane of an exemplary graphical user interface (GUI) provided by the system in FIG. 1, enabling a system user to evaluate data file transfer parameters based on the information shown in FIG. 4A, according to one implementation.

Continuing to FIG. 5, FIG. 5 shows analysis pane 500 for evaluating the parameters files 332/432 and threads 336/436 determined in action 202 based on the information shown in FIG. 4A. In addition to the parameters described above by reference to FIG. 4A, analysis pane 500 identifies the same workspaces 514 utilized as test data and shown in FIG. 3. In addition, analysis pane 500 includes menu 550 for choosing one or more of the parameters, mean file size 442, threads 336/436, space used 316/416, space delta 444, space delta per gigabyte 446, and files 332/432, for use in providing an algorithm to estimate elapsed time 334/434 for performing file transfers using file transfer protocol "A." Analysis pane 500 also includes "Perform Regression" selector 552 for analyzing the parameters chosen from menu 550, as well as "Save Coefficients" selector 554 for saving the coefficients for each of the parameters chosen from menu 550 and identified as a result of regression analysis.

Figure 6A:
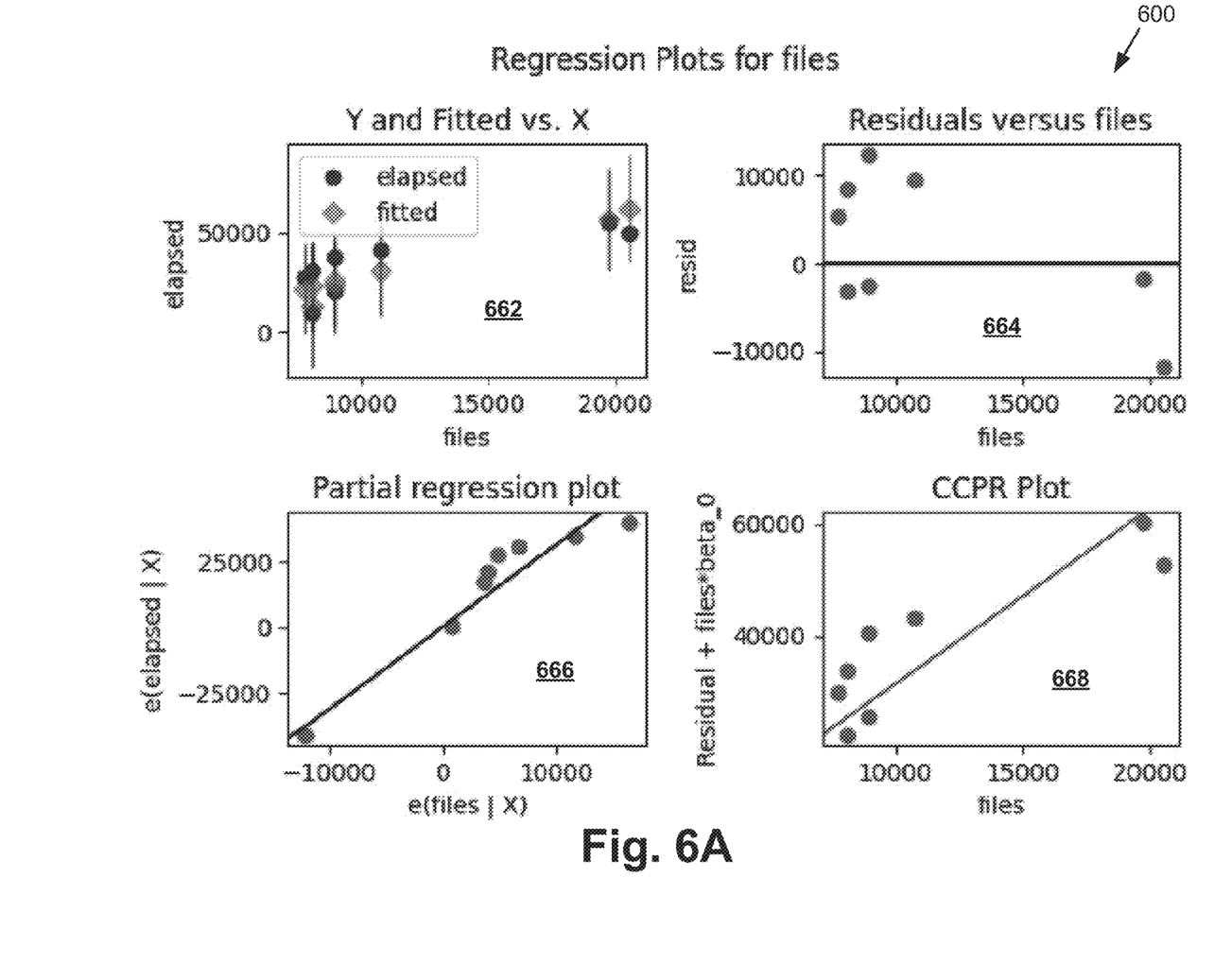
FIG. 6A shows exemplary regression plots for a particular data file transfer parameter identified in FIG. 4A, according to one implementation.

FIG. 6A shows regression plots 600 for the parameter, files 332/432. As shown in FIG. 6A, regression plots 600 include Y and Fitted vs. X plot 662, Residuals versus files plot 664, Partial regression plot 666, and component and component-plus-residual (CCPR) plot 668, as known in the art. Regression plots 600 are produced as a result of complex linear regressions applied to the parameter files 332/432. It is noted that although not shown in FIG. 6A, an analogous set of regression plots are generated for the parameter, threads 336/436, that has been determined in action 202 based on the information provided by correlation heatmap 400A and covariance heat chart 401.

Figure 6B:
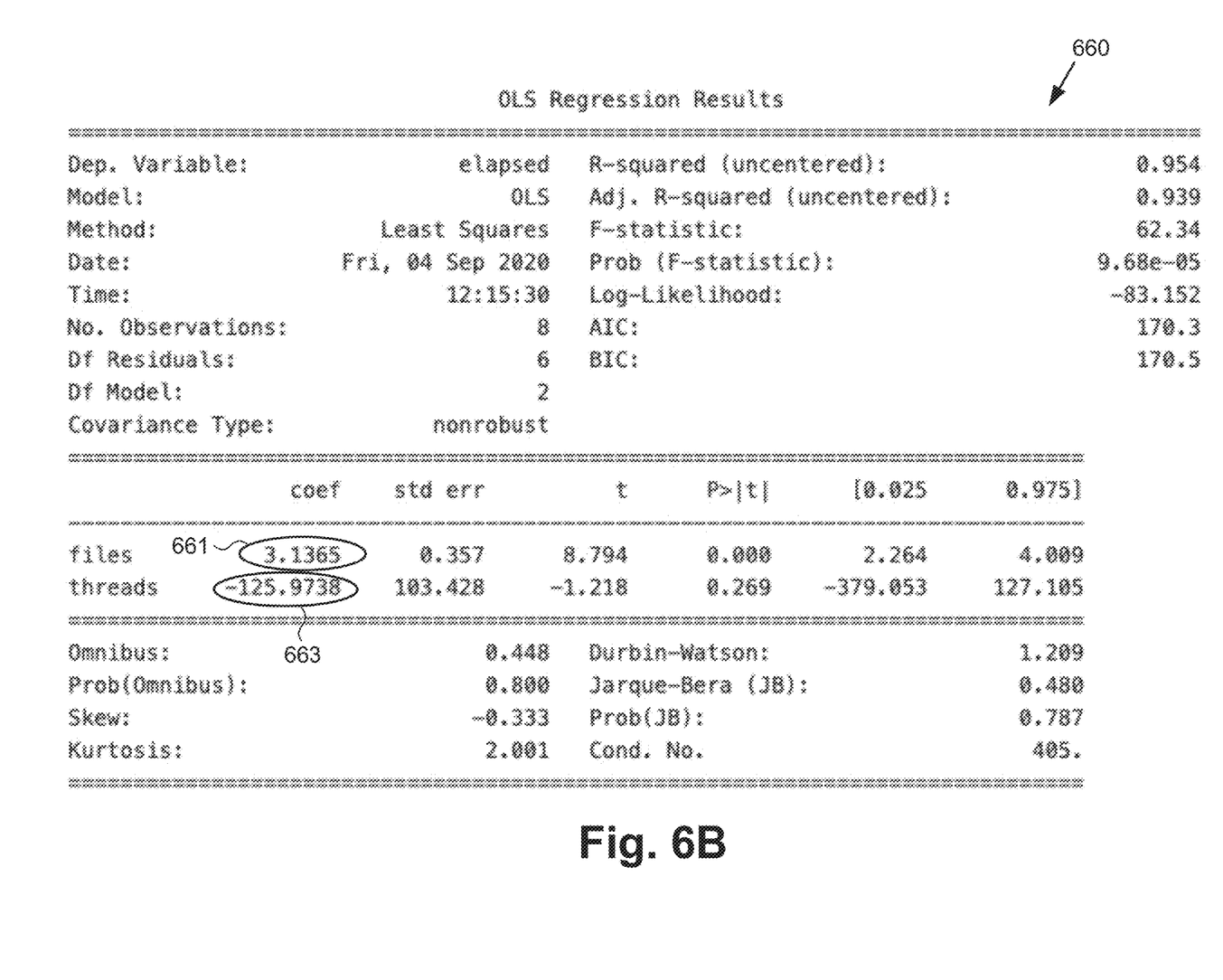
FIG. 6B shows an exemplary regression analysis report summarizing the regression analysis of some data transfer parameters shown in FIG. 4A.

FIG. 6B shows regression analysis report 660 summarizing the regression analysis of the parameters, files 332/432 and threads 336/436, as well as identifying their respective coefficients 661 and 663. It is noted that, based on the regression analysis summarized in regression analysis report 660, the parameter files 332/432, files coefficient 661, the parameter threads 336/436, and threads coefficient 663 can be used to provide an algorithm for transferring the one or more files using file transfer protocol "A."

It is noted that, in some implementations, regression plots 600 and regression analysis report 660 may be reviewed by system user 111 via GUI 109. However, in other implementations, FIGS. 5, 6A, and 6B may be merely representative of automated calculations performed by file transfer modeling software code 108 without human input from system user 111.

Flowchart 200 further includes providing, based on the one or more parameters determined in action 202, an algorithm for transferring the one or more files using the file transfer protocol identified in action 201, e.g., file transfer protocol "A" (action 203). Action 203 may be performed by file transfer modeling software code 108, executed by processing hardware 104 of computing platform 102, or executed by user system processing hardware 124 of user system 120. In implementations in which multiple parameters are determined to be correlated with file transfer time for the file transfer protocol identified in action 201, one or more of those parameters may be excluded from the algorithm provided in action 203, due, for example, to high covariance with another parameter. That is to say, in some implementations, the algorithm provided in action 203 may be further based on one or more identified covariances among parameters, and may exclude some parameters due to covariances, thereby using less than all of the parameters determined to be correlated with file transfer time in action 202 when providing the algorithm in action 203.

Figure 7:
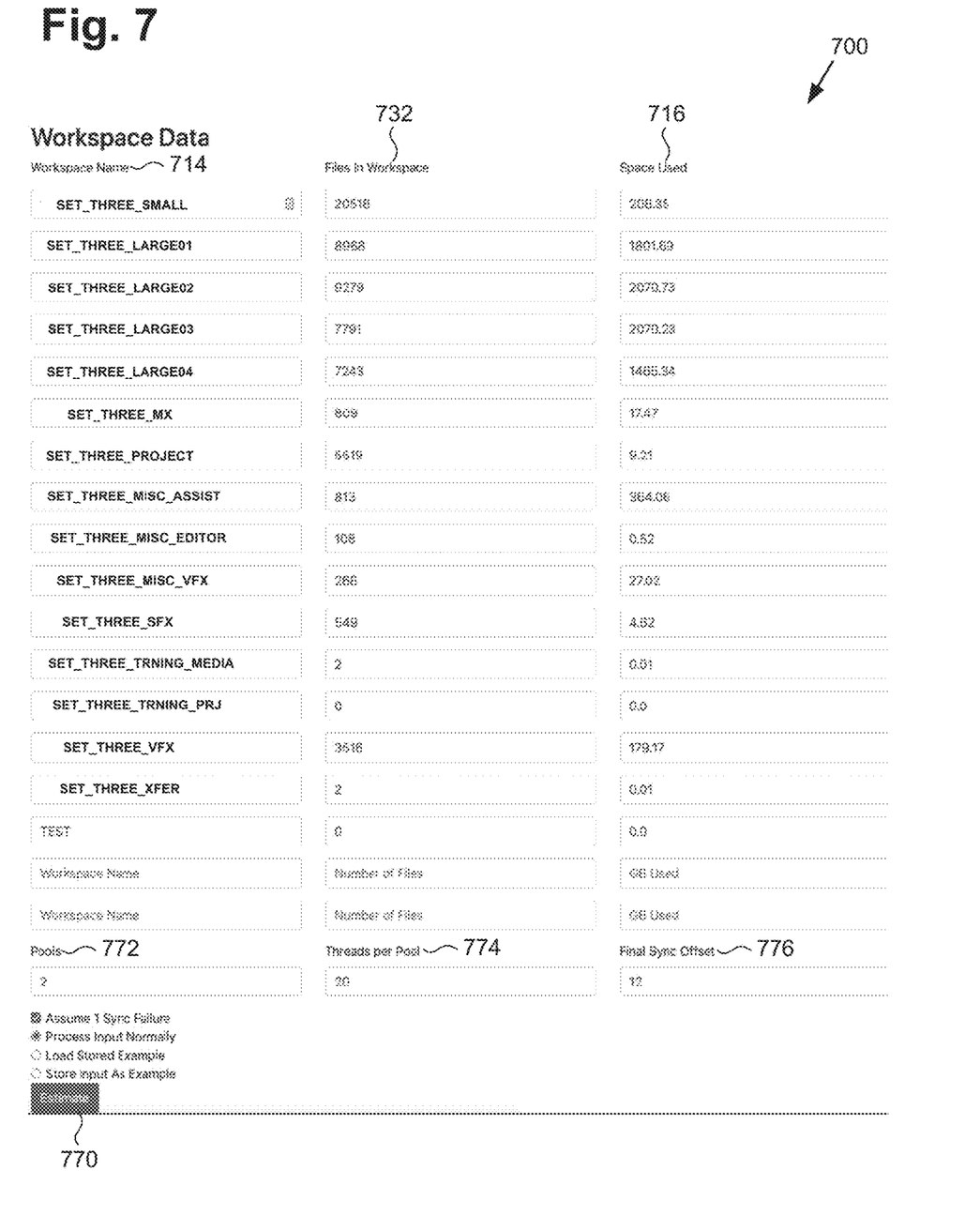
FIG. 7 shows an exemplary file transfer simulation pane of a GUI provided by the system shown in FIG. 1, according to one implementation.

Flowchart 200 further includes performing, using the algorithm provided in action 203, a file transfer simulation of the one or more files using the file transfer protocol identified in action 201 (action 204). Referring to FIG. 7, FIG. 7 shows file transfer simulation pane 700 for identifying the particular workspaces 714 to be transferred using file transfer protocol "A," as well as the number of files 732 in each of workspaces 714 and the space used 716 by the files contained in each of workspaces 714. Also shown in FIG. 7 are fields identifying the number of parallel processing pools 772 of data that may be utilized for file transfer, the number of threads 774 committed to each pool 772, and the final synchronization offset 774 for the estimation process. In addition, file transfer simulation pane 700 includes "Estimate" selector 770 for initiating the file transfer simulation process using file transfer protocol "A." The file transfer simulation of action 204 may be performed by file transfer modeling software code 108, executed by processing hardware 104 of computing platform 102, or executed by user system processing hardware 124 of user system 120.

Figure 8A:
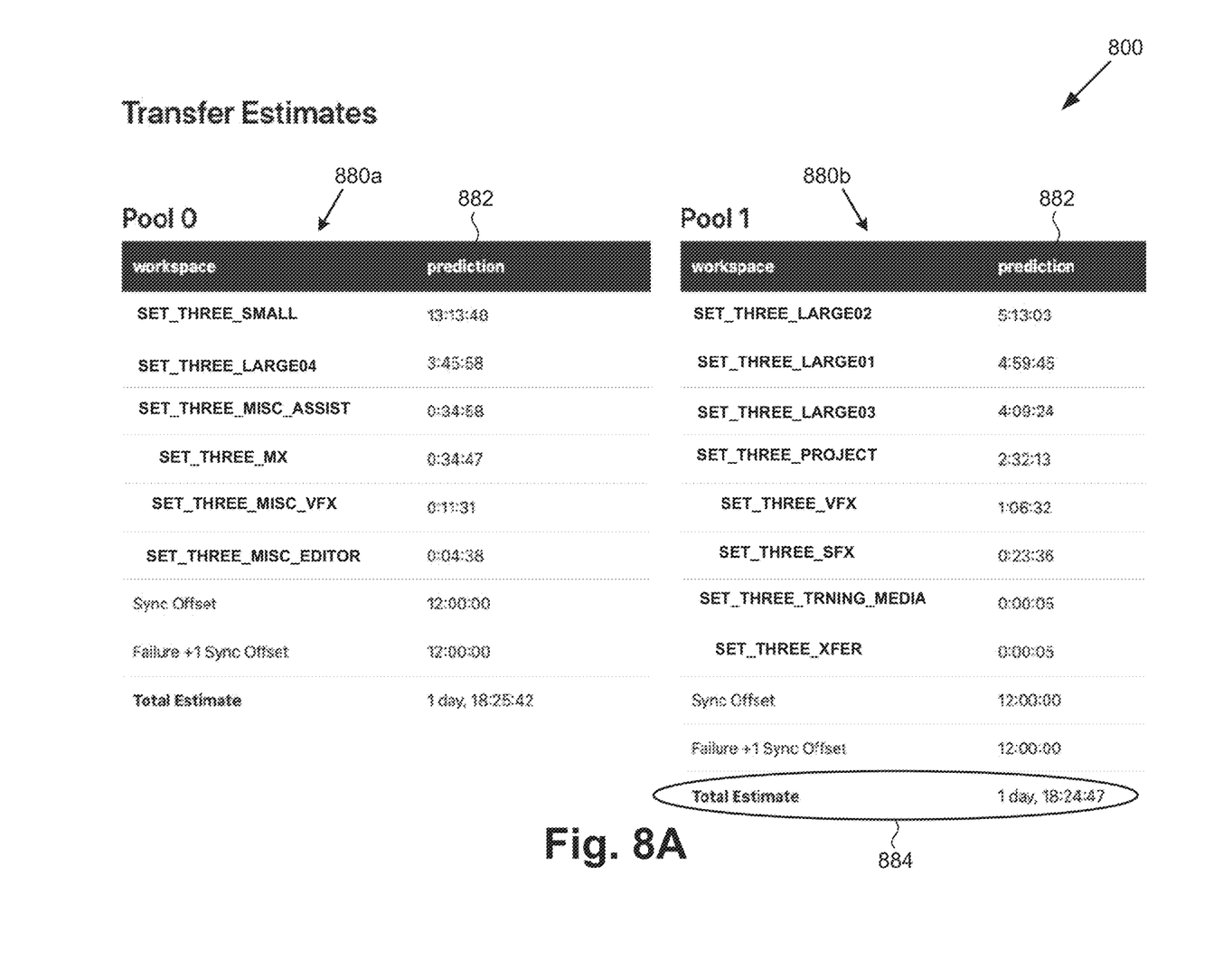
FIG. 8A shows an exemplary file transfer estimate report resulting from a file transfer simulation performed by the system shown in FIG. 1, according to one implementation.

Flowchart 200 further includes providing, using the file transfer simulation, data pooling parameters for transferring the one or more files using the file transfer protocol identified in action 201 (action 205). FIG. 8A shows File Transfer Estimate report 800 resulting front the file transfer simulation performed by file transfer modeling software code 108 in action 204, executed either by processing hardware 104 of system 100, or by user system processing hardware 124 of user system 120, and using the workspaces identified in FIG. 7 as well as the parameters, files 332/432 and threads 336/436 files coefficient 661, and threads coefficient 663, identified in regression analysis report 660. As shown in FIG. 8A, File Transfer Estimate report 800 provides data pooling parameters 880*a* and 880*b* for optimizing parallelization of the file transfer process. That is to say, data pooling parameters 880*a* and 880*b* include instructions for transfer of multiple data pools in parallel. Action 205 may be performed by file transfer modeling software code 108, executed by processing hardware 104 of computing platform 102, or executed by user system processing hardware 124 of user system 120.

Flowchart 200 further includes estimating, based on the file transfer simulation performed in action 208 and data pooling parameters 880*a* and 880*b*, elapsed time 884 for transferring the one or more files (action 206). As further shown in FIG. 8A, File Transfer Estimate report 800 provides predictions 882 for elapsed time 334/434 for file transfer of each of workspaces 714 individually using file transfer protocol "A," as well as total elapsed time estimate 884 for transfer of all workspace files identified in FIG. 7 using file transfer protocol "A." Action 206 may be performed by file transfer modeling software code 108, executed by processing hardware 104 of computing platform 102, or executed by user system processing hardware 124 of user system 120.

Figure 8B:
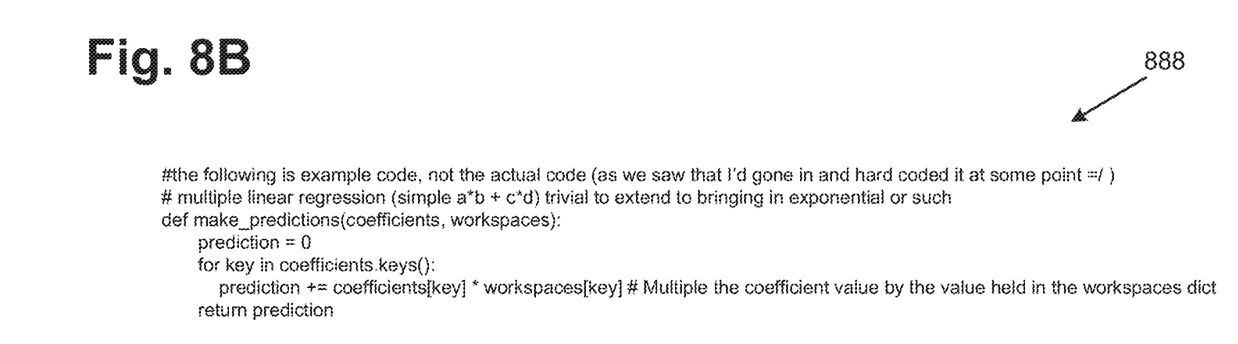
FIG. 8B shows exemplary pseudocode corresponding to generation of individual predictions for the time required to transfer each of one or more data files based on the data transfer simulation described by the report shown in FIG. 8A, according to one implementation.
Figure 8C:
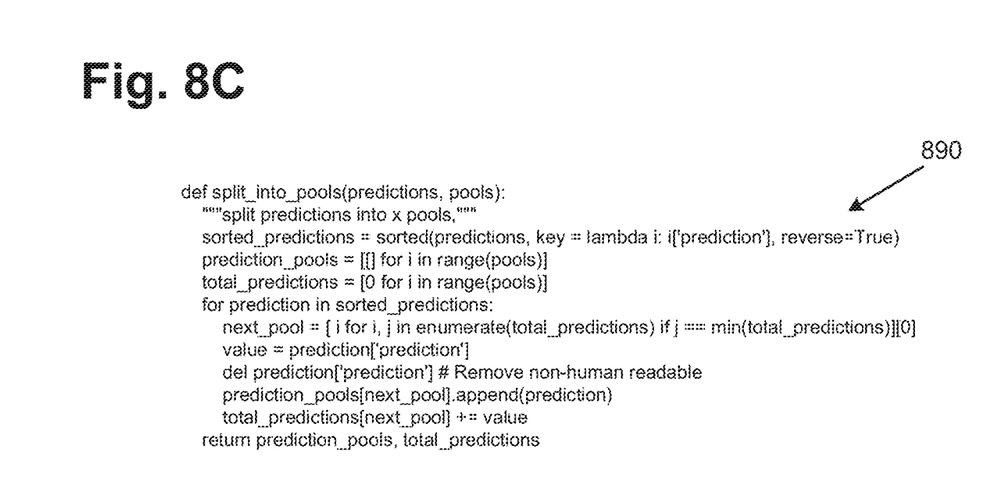
FIG. 8C shows exemplary pseudocode corresponding to generation of data pooling parameters for transferring one or more data files, according to one implementation.
Figure 8D:
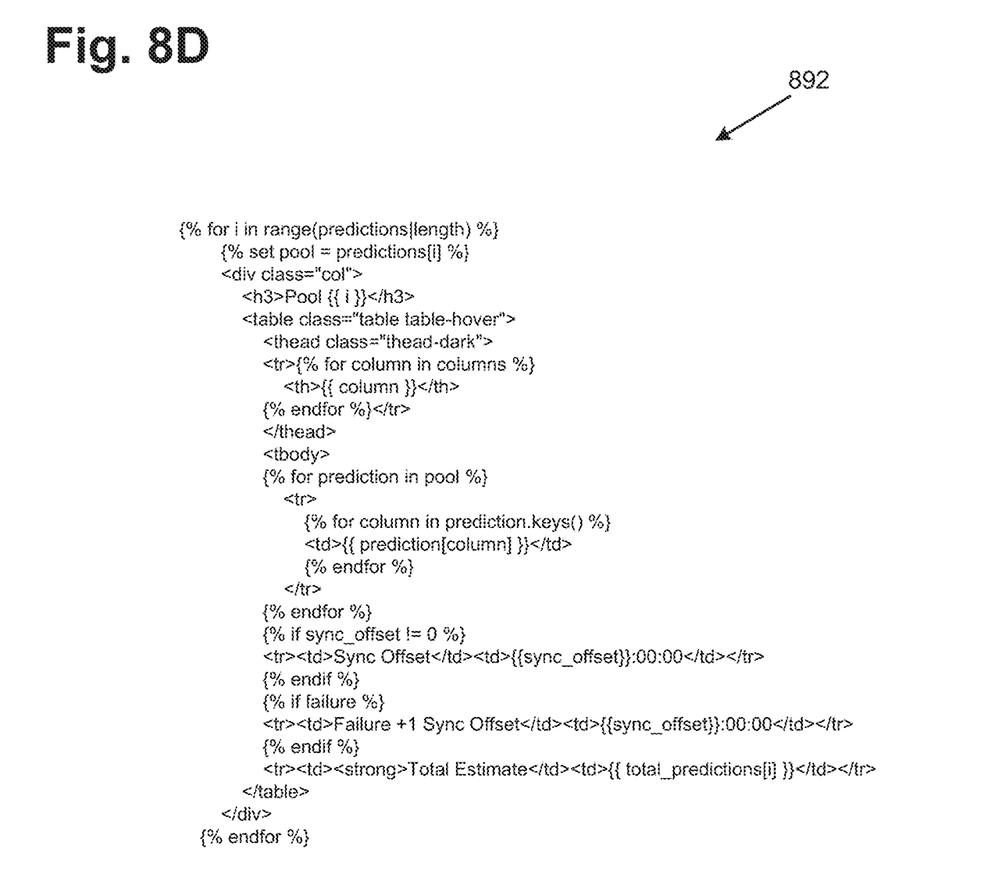
FIG. 8D shows exemplary pseudocode corresponding to generation of a total elapsed time estimate for transferring one or more data files, according to one implementation.

Referring to FIGS. 8B, 8C, and 8D, FIG. 8B shows exemplary pseudocode 888 corresponding to generation of each of individual predictions 882, FIG. 8C shows exemplary pseudocode 890 corresponding to generation of pooling parameters 880*a* and 880*b*, and FIG. 8D shows exemplary pseudocode 892 corresponding to generation of total elapsed time estimate 884.

It is possible that in some instances one or more elapsed time predictions 882 may exceed an acceptable time duration criterion, such as a predetermined maximum time threshold, for example. In those use cases, it may be advantageous or desirable to switch to another file transfer protocol, or to compare elapsed time predictions 882 using file transfer protocol "A" to analogous predictions using another file transfer protocol. In those latter use cases, actions 201, 202, 203, 204, 205, and 206 (hereinafter "actions 201-206") may be repeated for a file transfer protocol other than file transfer protocol "A." Alternatively, failure by one or more of elapsed time predictions 882 for file transfer protocol "A" to meet an acceptable time duration criterion may result in modification of the algorithm provided in action 203, or modifications to one or more parameters determined in action 202 to be correlated with the time required for transferring files using file transfer protocol "A." As yet another alternative, failure by one or more of elapsed time predictions 882 for file transfer protocol "A" to meet an acceptable time duration criterion may result in changes to the computing resources dedicated to transferring files using file transfer protocol "A," such as increasing the computational core count to accommodate more threads 336/436, for example.

It is noted that although action 206 is shown by flowchart 200 to follow action 205, that representation is merely exemplary. In some implementations, actions 205 and 206 may be performed in parallel, i.e., substantially concurrently. Thus, in some implementations, as shown in FIG. 8A, file transfer modeling software code 108, when executed by processing hardware 104 of computing platform 102, or when executed by user system processing hardware 124 of user system 120, may provide data pooling parameters 880*a* and 880*b* and may estimate elapsed time 884 for transferring the one or more files, concurrently. It is further noted that, in some implementations, actions 201-206 may be performed in an automated process from which human involvement may be omitted.

Thus, the present application discloses a multi-protocol file transfer modeling solution that overcomes the drawbacks and deficiencies in the conventional art. As discussed above, in one exemplary implementation, a sample of test data is used to probe the performance characteristics of a file transfer protocol in order to identify which data parameters correlate most strongly with the time required to transfer data using that protocol. Based on those correlations, as well as, in some implementations, covariances amongst the parameters, an algorithm for governing file transfer can be provided that is substantially optimized for the file transfer protocol to be used, as well as for the one or more files to be transferred. That algorithm can then be used to simulate file transfer so as to provide data pooling parameters for performing file transfer in parallel, as well as an estimate of total elapsed time for file transfer that is substantially more accurate than those presently obtainable from the conventional art. For example, the file transfer models generated according to the present novel and inventive principles have been shown to be accurate to within less than plus-or-minus ten percent of the actual elapsed time required for actual file transfer. Moreover, in some implementations, the present novel and inventive concepts further advantageously enable performance of the disclosed multi-protocol file transfer modeling solution as an automated process.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

What is claimed is:

1. A system comprising:
   a computing platform having processing hardware and a system memory storing a software code including a trained machine learning (ML) model;
   the processing hardware configured to execute the software code to:
   identify a file transfer protocol among a plurality of file transfer protocols for transferring one or more files;
   determine, using the trained ML model, a test data sample and the file transfer protocol, a plurality of parameters correlated with a time required for transferring the one or more files using the file transfer protocol;
   identify a covariance among the plurality of parameters;
   provide, based on the covariance and at least one of the plurality of parameters, an algorithm for transferring the one or more files using the file transfer protocol;
   perform, using the algorithm, a file transfer simulation of the one or more files using the file transfer protocol;
   provide, using the file transfer simulation, data pooling parameters for transferring the one or more files; and
   estimate, based on the file transfer simulation and the data pooling parameters, an elapsed time for transferring the one or more files.

2. The system of claim 1, wherein the processing hardware is further configured to execute the software code to:
   provide a graphical user interface (GUI) enabling a system user to review the plurality of parameters.

3. The system of claim 1, wherein the processing hardware is further configured to execute the software code to:
   provide, using more than one but less than all of the plurality of parameters, the algorithm for transferring the one or more files using the file transfer protocol.

4. The system of claim 3, wherein the processing hardware is further configured to execute the software code to:
   identify at least two of the plurality of parameters as covariant parameters; and
   exclude the covariant parameters from the algorithm for transferring the one or more files using the file transfer protocol.

5. The system of claim 4, wherein the processing hardware is further configured to execute the software code to:
   provide a GUI enabling a system user to review the plurality of parameters; and
   wherein the covariant parameters are identified based on system user inputs to the GUI.

6. The system of claim 1, wherein the data pooling parameters comprise instructions for transfer of a plurality data pools in parallel.

7. The system of claim 1, wherein the processing hardware is further configured to execute the software code to concurrently provide the data pooling parameters and estimate the elapsed time for transferring the one or more files.

8. The system of claim 1, wherein the one or more files comprise a plurality of files, and wherein the plurality of parameters comprise at least one of a total number of files included in the plurality of files or a mean size of files included in the plurality of files.

9. The system of claim 1, wherein the covariance among the plurality of parameters is identified using the trained ML model.

10. A method for use by a system including a computing platform having a processing hardware and a system memory storing a software code and a trained machine learning (ML) model, the method comprising:
    identifying, by the software code executed by the processing hardware, a file transfer protocol among a plurality of file transfer protocols for transferring one or more files;
    determining, by the software code executed by the processing hardware and using the trained ML model, a test data sample and the file transfer protocol, a plurality of parameters correlated with a time required for transferring the one or more files using the file transfer protocol;
    identifying, by the software code executed by the processing hardware, a covariance among the plurality of parameters;
    providing, by the software code executed by the processing hardware based on the covariance and at least one of the plurality of parameters, an algorithm for transferring the one or more files using the file transfer protocol;
    performing a file transfer simulation, by the software code executed by the processing hardware and using the algorithm, of the one or more files using the file transfer protocol;
    providing, by the software code executed by the processing hardware and using the file transfer simulation, data pooling parameters for transferring the one or more files; and
    estimating, by the software code executed by the processing hardware based on the file transfer simulation and the data pooling parameters, an elapsed time for transferring the one or more files.

11. The method of claim 10, further comprising:
    providing, by the software code executed by the processing hardware, a graphical user interface (GUI) enabling a system user to review the plurality of parameters.

12. The method of claim 10, further comprising:
    wherein the algorithm for executing the file transfer of the dataset using the file transfer protocol is provided using more than one but less than all of the plurality of parameters, the algorithm for transferring the one or more files using the file transfer protocol.

13. The method of claim 12, further comprising:
    identifying, by the software code executed by the processing hardware, at least two of the plurality of parameters as covariant parameters; and
    excluding, by the software code executed by the processing hardware, the covariant parameters from the algorithm for transferring the one or more files using the file transfer protocol.

14. The method of claim 13, further comprising:
    providing, by the software code executed by the processing hardware, a GUI enabling a system user to review the plurality of parameters; and
    wherein the covariant parameters are identified based on one or more system user inputs to the GUI.

15. The method of claim 10, wherein the data pooling parameters comprise instructions for transfer of a plurality data pools in parallel.

16. The method of claim 10, wherein providing the data pooling parameters and estimating the elapsed time for transferring the one or more files are performed concurrently.

17. The method of claim 10, wherein the one or more files comprise a plurality of files, and wherein the plurality of parameters comprise at least one of a total number of files included in the plurality of files or a mean size of files included in the plurality of files.

18. The method of claim 10, wherein the covariance among the plurality of parameters is identified using the trained ML model.

\* \* \* \* \*